United States Patent
Beattie

[11] Patent Number: 5,934,965
[45] Date of Patent: Aug. 10, 1999

[54] APERTURED NONPLANAR ELECTRODES AND FORMING METHODS

[75] Inventor: John R. Beattie, Westlake Village, Calif.

[73] Assignee: Hughes Electronics Corporation, El Segundo, Calif.

[21] Appl. No.: 08/833,742

[22] Filed: Apr. 11, 1997

[51] Int. Cl.⁶ ........................................ H01J 9/02
[52] U.S. Cl. ................ 445/49; 216/52; 216/56
[58] Field of Search ............. 216/52, 56; 445/49

[56] References Cited

U.S. PATENT DOCUMENTS 3,325,319  6/1967  Frantzen ................ 216/52 X
3,947,933  4/1976  Banks et al. .
4,825,646  5/1989  Dorian et al. .
5,448,883  9/1995  Meserole, Jr. et al. ............ 60/202

FOREIGN PATENT DOCUMENTS

0575848A2  12/1993  European Pat. Off. .
2150312    6/1985   United Kingdom .

*Primary Examiner*—Kenneth J. Ramsey
*Attorney, Agent, or Firm*—V. D. Duraiswamy; M. W. Sales

[57] ABSTRACT

Positional accuracy of apertures in nonplanar electrodes is improved with a new fabrication method. This method precedes process steps which establish a photoresist pattern that defines apertures with deformation steps which produce a nonplanar electrode. Thus, the deformation steps do not have an opportunity to spatially alter the photoresist pattern. The improved positional accuracy enhances the performance and lifetime of ion thrusters which include nonplanar electrodes that are fabricated with this process.

31 Claims, 6 Drawing Sheets

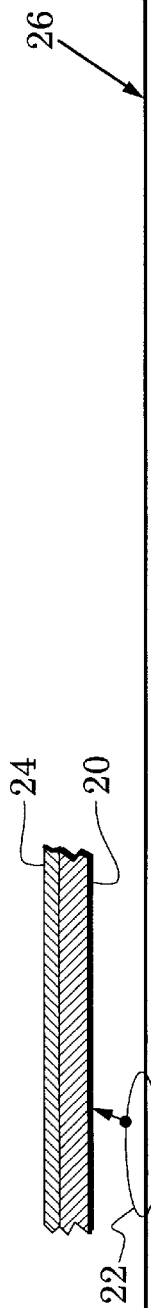
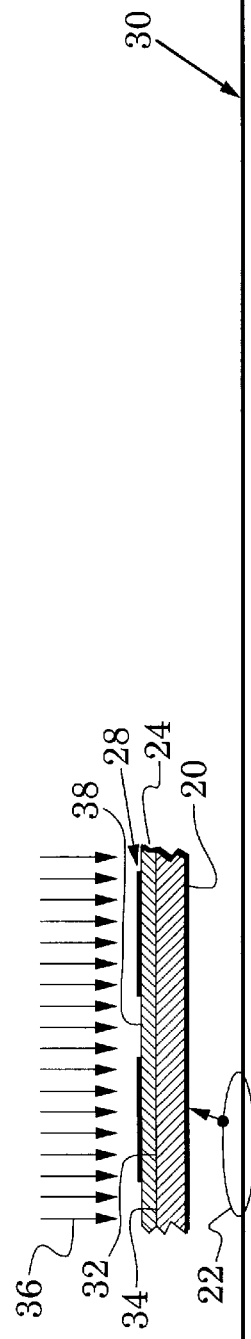
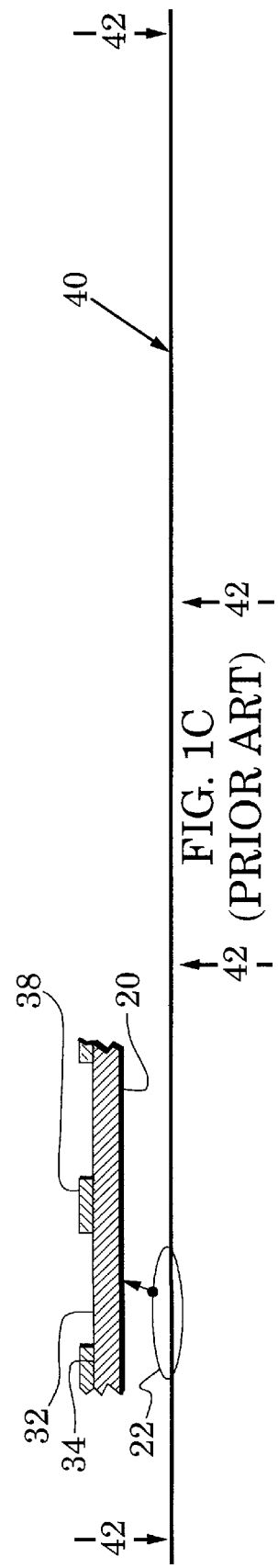
FIG. 1A (PRIOR ART)
FIG. 1B (PRIOR ART)
FIG. 1C (PRIOR ART)

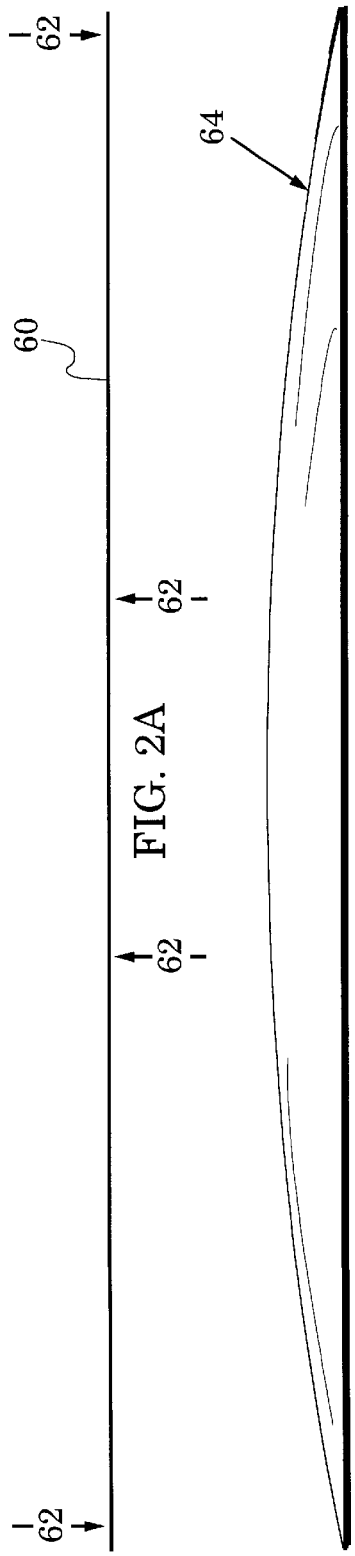
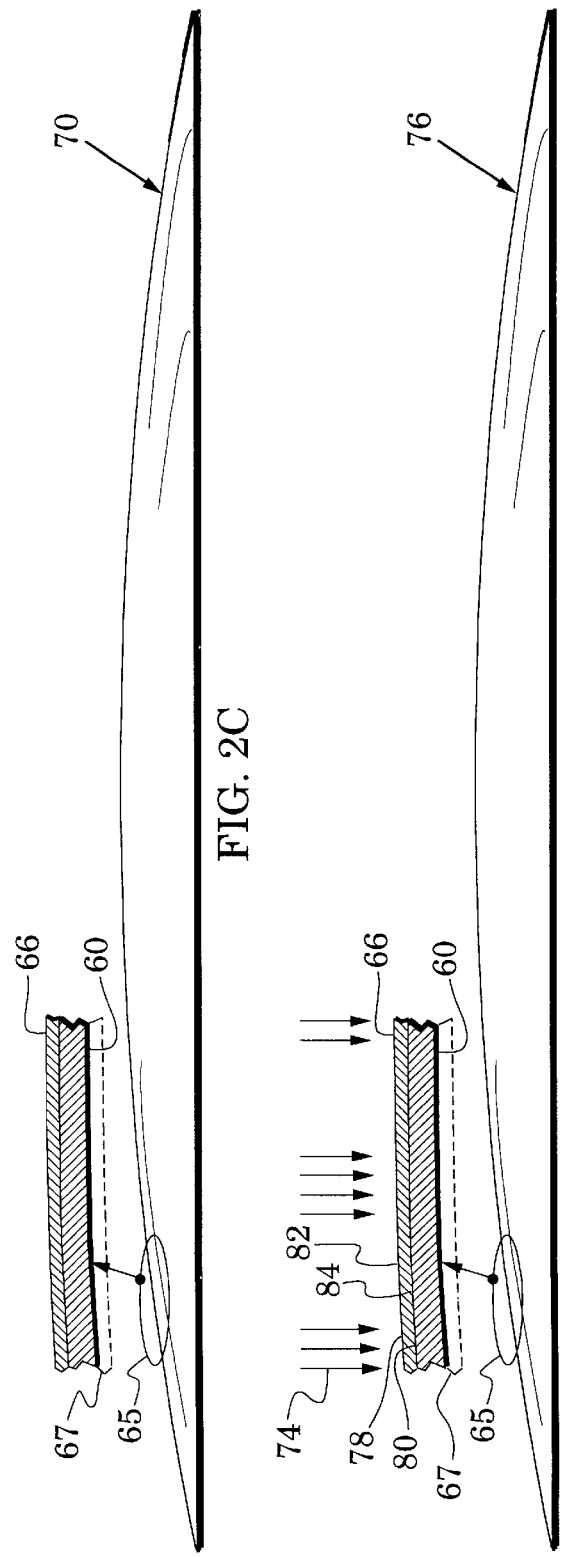
FIG. 2A
FIG. 2B
FIG. 2C
FIG. 2D

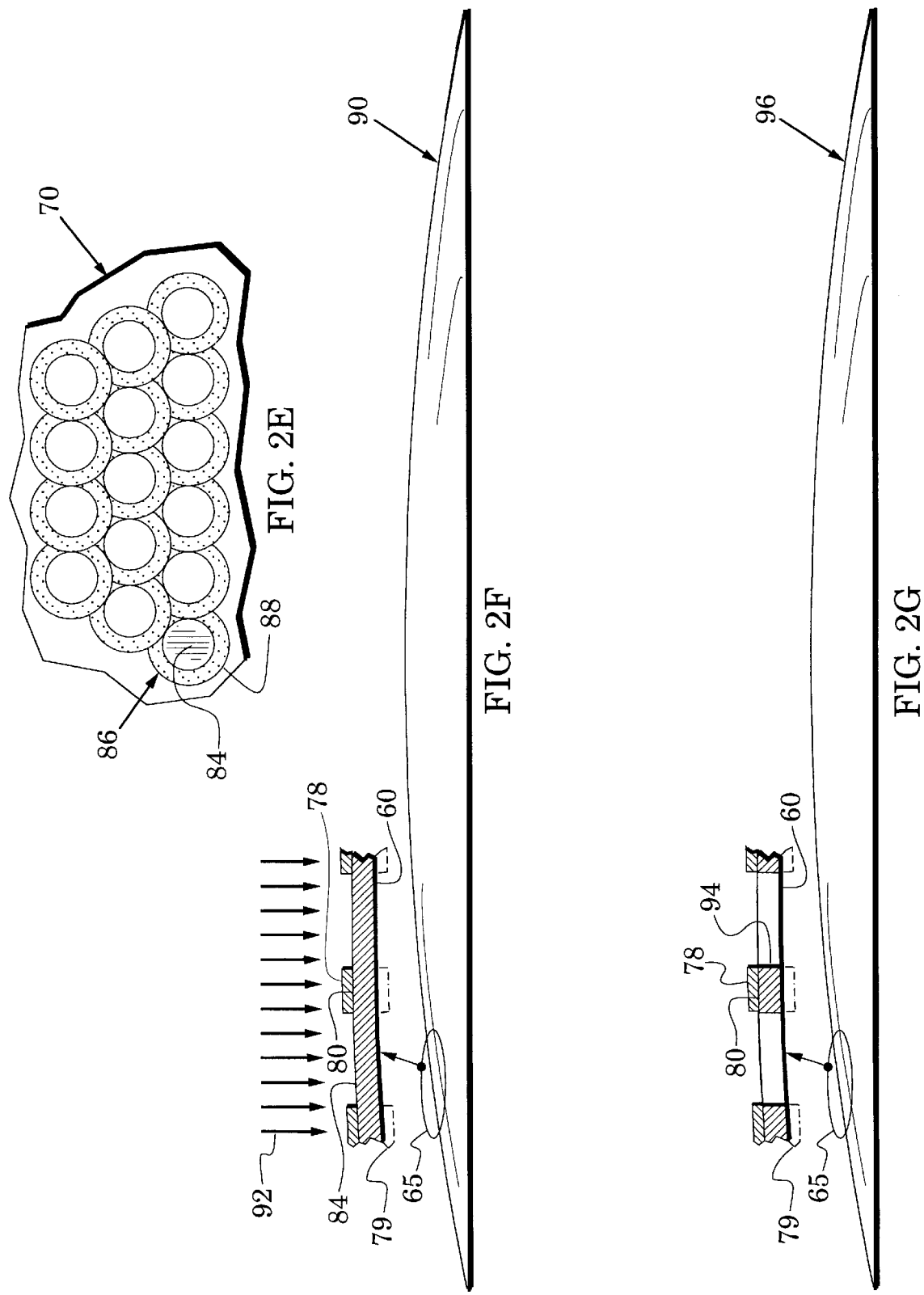

APERTURED NONPLANAR ELECTRODES AND FORMING METHODS

BACKGROUND OF THE INVENTION

1. Field of the Invention

The present invention relates generally to spacecraft propulsion systems and, more particularly, to ion thrusters.

2. Description of the Related Art

On-board propulsion systems facilitate a number of spacecraft maneuvers. In satellites, for example, these maneuvers include orbit raising (e.g., from a low Earth orbit to a geostationary orbit), stationkeeping (e.g., correcting orbit inclination, drift and eccentricity) and attitude control (e.g., correcting attitude errors about a satellite's roll, pitch and yaw axes).

The force exerted on a spacecraft by a propulsion system's thruster is expressed in equation (1)

$$F = \dot{m}v_e = \frac{\dot{w}}{g}v_e = \dot{w}I_{sp} \quad (1)$$

as the product of the thruster's mass flow rate and exhaust velocity. Equation (1) also shows that mass flow rate can be replaced by the ratio of weight flow rate to the acceleration of gravity and that the ratio of exhaust velocity to the acceleration of gravity can be represented by specific impulse $I_{sp}$ which is a thruster figure of merit. Equation (1) can be rewritten as equation (2)

$$I_{sp} = \frac{F}{\dot{w}} \quad (2)$$

to show that specific impulse is the ratio of thrust to weight flow rate.

A velocity increase $\Delta V$ of a spacecraft is gained with a loss in mass of the thruster's stored fuel. Accordingly, a differential occurs between the spacecraft's initial mass $M_i$ (prior to the maneuver) and the spacecraft's final mass $M_f$ (after the maneuver). This mass differential is a function of the thruster's specific impulse $I_{sp}$ as expressed by the "rocket equation" of $$M_f = M_i e^{-\left(\frac{\Delta V}{gI_{sp}}\right)} \quad (3)$$

in which $\Delta V$ has units of meters/second, $I_{sp}$ has units of seconds and acceleration of gravity g has units of meter/second$^2$. Equation (3) states that fuel use causes a spacecraft's final mass $M_f$ to exponentially decrease with increased $\Delta V$ and that this decrease can be exponentially offset by an increase in specific impulse $I_{sp}$.

Therefore, specific impulse is an important measure of a thruster's fuel efficiency. Typical specific impulses are 230 seconds for monopropellant (e.g., hydrazine) thrusters, 290 seconds for solid propellant thrusters, 445 seconds for bipropellant (e.g., liquid hydrogen and liquid oxygen) thrusters and 500 seconds for electric arc jet thrusters. In contrast, ion thrusters have been developed with specific impulses in excess of 2500 seconds.

The high specific impulse of ion thrusters can facilitate a reduction of initial satellite mass, an increased payload and a longer on-orbit lifetime. Reduction of initial mass lowers the spacecraft's initial launch cost and increased payload and longer lifetime increase the revenue that is generated by the spacecraft.

A key component of an ion thruster is its ion-optics system which is configured of multiple, closely-spaced electrodes that extract an ion beam from a plasma source. In a typical three-electrode system, the electrodes are referred to as a screen grid, an accelerator grid and a decelerator grid. An array of aperture sets are formed by these grids with each aperture set including one aperture of each of the three grids.

Voltages on the grids cause each of the aperture sets to extract ions from the plasma source and eject them as an ion beamlet. The ion beamlets combine to form an ion beam which is accelerated away from the ion-optics system. The ion beam's momentum generates an opposite force upon the ion thruster and attached structures (e.g., a spacecraft).

To enhance the ion beam's thrust and the thruster's lifetime, the alignment of each aperture set must be precisely established and maintained. An ion thruster's performance is a function of its current extraction which, in turn, is a function of ion beamlet alignment and, hence, of aperture set alignment. Thruster lifetime is degraded when aperture set misalignment causes ion beamlets to intersect an electrode and damage it by sputtering material from the electrode. This sputtered material can also shorten spacecraft lifetime if it deposits on sensitive surfaces (e.g., solar cells).

Alignment maintainence over temperature is typically enhanced by forming each of the electrodes with a spherical shape to reduce temperature-induced inter-grid movement. For example, each electrode in an exemplary 13 centimeter diameter ion thruster comprises a molybdenum sheet having a thickness in a range of 0.25–0.50 millimeters and a radius of curvature of ~50 centimeters. The electrodes of this exemplary thruster form 3145 aperture sets.

Aperture set alignment is a function of the positional accuracy of each electrode's apertures. In the conventional electrode fabrication process illustrated in FIGS. 1A–1F, this positional accuracy has been found to be limited to ~125 micrometers. This process begins with a circular molybdenum sheet 20. Because the sheet is quite thin, a portion of the sheet within an ellipse 22 is enlarged in each of FIGS. 1A–1E and shown immediately above the sheet 20 to illustrate process details.

In FIG. 1A, the sheet 20 is first coated with a negative light-sensitive photoresist 24 to form a coated electrode 26. In FIG. 1B, a mask 28 (e.g., a patterned photographic plate) is placed over the photoresist 24 to form an electrode assembly 30. The mask is designed to cover aperture portions 32 and to not cover web portions 34 of the sheet 20. Next, the electrode assembly 30 is uniformly radiated with radiation 36 so that the photoresist portions 38 which are not covered by the mask 28 are exposed to the radiation. In a negative photoresist, the unexposed portions can then be dissolved away to form the prepared sheet 40 of FIG. 1C in which only the photoresist portions 38 remain over the sheet web portions 34.

The prepared sheet 40 is next deformed from its shape in FIG. 1C to realize a prepared spherical electrode 44 that is shown in FIG. 1D (the force arrows 42 of FIG. 1C exemplify the deforming process). Accordingly, the enlarged structure within the ellipse 22 of FIG. 1D now indicates a radius of curvature. A chemical etchant 46 is applied in FIG. 1D and the aperture portions 32 are etched away to form apertures 48 that are separated by web portions 34 as shown in the etched spherical electrode 50 of FIG. 1E. In a final step, the photoresist portions 38 are removed to realize the apertured spherical electrode 52 of FIG. 1F which has an array 54 of apertures 48 that are separated by webs 34.

It has been determined that the deformation of FIGS. 1C and 1D stretches the sheet 20 which alters the locations of the photoresist portions 38 of FIG. ID in an unpredictable and uncontrollable manner. Consequently, the positional accuracy of the apertures 48 of FIG. 1E is limited, as recited above, to ~130 microns and electrodes fabricated with the conventional process of FIGS. 1A–1F degrade the aperture set alignment of ion-optics systems.

SUMMARY OF THE INVENTION

The present invention is directed to the enhancement of performance and lifetime of any system in which ion-optics are used to form and accelerate ion beams. Such systems include ion thrusters, ion-beam implantation systems and neutral-beam accelerators. This enhancement is achieved by improving the positional accuracy of apertures in nonplanar electrodes of a multiple-grid ion-optics system.

The goal of improved positional accuracy is realized with a fabrication process that precedes process steps which produce a photoresist pattern with deformation steps that produce a nonplanar electrode. Therefore, no deformation process steps have an opportunity to spatially alter the photoresist pattern. Apertures in the nonplanar electrode are created by an etching process which is spatially controlled by the photoresist pattern. Because deformation processes were not allowed to alter the photoresist pattern, they cannot degrade the positional accuracy of the apertures.

Definition of the photoresist pattern on the nonplanar electrode is preferably accomplished with a laser beam. One process embodiment combines a ring-shaped laser beam with the use of negative photoresist and another process embodiment combines a circular laser beam with the use of positive photoresist.

Ion-optics systems of the invention have aperture sets in which the apertures are positioned within 50 micrometers (e.g., as close as ~25 micrometers) of a coaxial relationship.

The novel features of the invention are set forth with particularity in the appended claims. The invention will be best understood from the following description when read in conjunction with the accompanying drawings.

BRIEF DESCRIPTION OF THE DRAWINGS

FIGS. 1A–1F illustrate conventional process steps for fabricating an apertured nonplanar electrode of an ion thruster;

FIGS. 2A–2H illustrate process steps of the present invention for fabricating an apertured nonplanar electrode;

DETAILED DESCRIPTION OF THE PREFERRED EMBODIMENTS

Figure 1D:
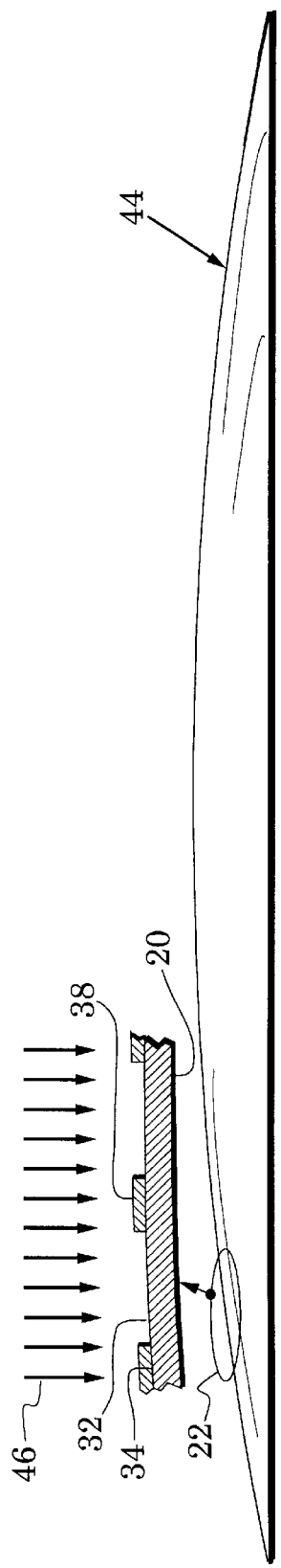
Figure 1E:
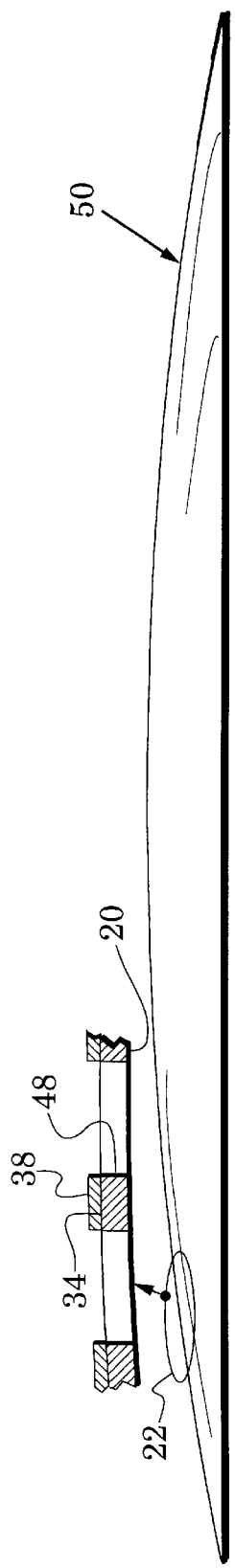

FIGS. 2A–2G illustrate a process of the present invention for fabricating an apertured nonplanar electrode. This fabrication process realizes enhanced positional accuracy of apertures because deformation steps of the process precede process steps that establish a precisely located photoresist pattern. Accordingly, unpredictable and uncontrollable electrode stretching that is induced by the deformation steps cannot spatially alter the photoresist pattern.

The process begins in FIG. 2A with a circular, metallic member in the form of a planar sheet 60. In FIG. 2A, the sheet 60 is deformed (deformation forces are exemplified by force arrows 62) to realize the nonplanar electrode 64 of FIG. 2B. Although this deformation can be accomplished with any conventional deformation process, it is preferably realized by hydroforming in which distributed pressures are applied via a liquid medium.

A portion of the sheet 60 within an ellipse 65 is enlarged in each of FIGS. 2C–2G and shown immediately above the sheet to illustrate the process details recited in conjunction with these figures. In FIG. 2C, the nonplanar sheet 60 is coated (e.g., by a spinning process) with a negative photoresist 66 to form a coated nonplanar electrode 70. In FIG. 2D, the coated nonplanar electrode 70 is radiated with a radiation 74 to form a radiated nonplanar electrode 76. As indicated in FIG. 2D, this process step radiates only photoresist portions 78 that cover future electrode web portions 80, i.e., photoresist portions 82 that cover future electrode aperture portions 84 of the electrode are not radiated.

Preferably, the step of FIG. 2D is realized with a ring-shaped laser beam 86 which is shown in FIG. 2E. The ring-shaped laser beam 86 is successively stepped across the coated nonplanar electrode 70 of FIG. 2C in successive rows as shown in FIG. 2E. Thus, at each step the annular portion 88 of the laser beam radiates future web portions of the coated nonplanar electrode 70 but does not radiate future aperture portions 84. The laser beam 86 is blanked off between each laser beam step so that the aperture portions 84 are not radiated as the laser beam is stepped to the next successive position.

When negative photoresist is radiated, photosensitizers in the photoresist are cross-linked with a base polymer so that the radiated photoresist is not easily dissolved during development of the photoresist. Thus, the nonradiated portions of the photoresist can be developed away leaving the radiated portions behind. As a result of this process step, only the radiated photoresist portions 78 remain over web portions 80 of a prepared nonplanar electrode 90 that is illustrated in FIG. 2F.

Figure 2H:
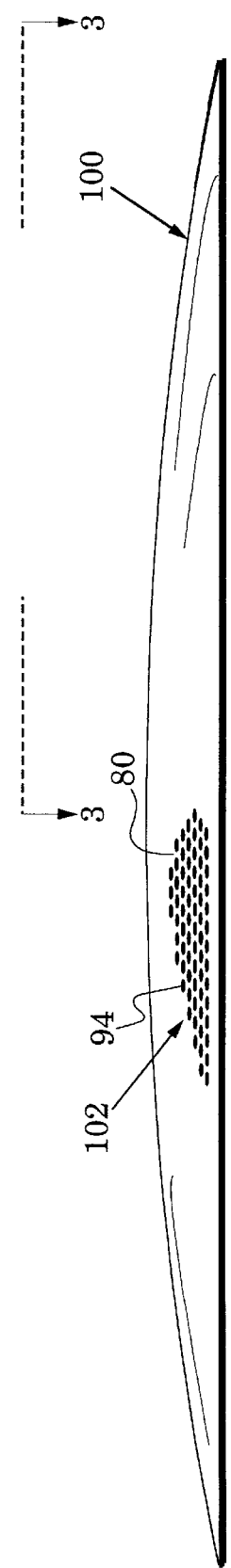

In FIG. 2F, the prepared nonplanar electrode 90 is etched with a chemical etchant 92 which etches away the uncoated aperture portions 84 to create apertures 94 in the etched nonplanar electrode 96 of FIG. 2G. Finally, the photoresist portions 78 are removed (e.g., by solvents) to realize the apertured nonplanar electrode 100 of FIG. 2H which has an array 102 of apertures 94 that are separated by webs 80.

Figure 3:
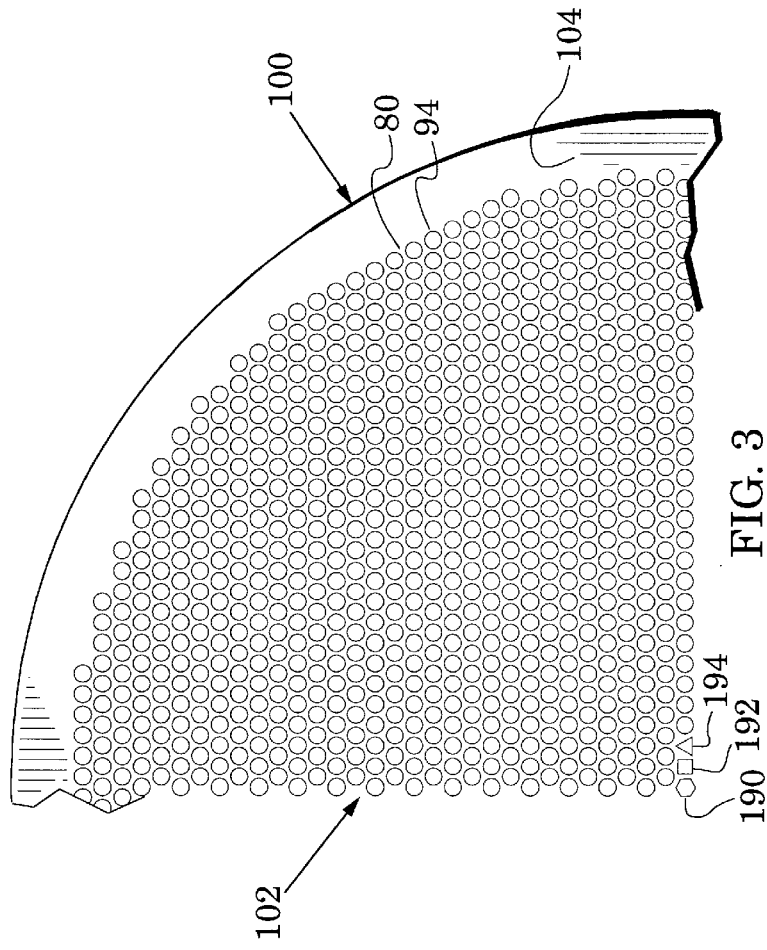
FIG. 3 is a view along the plane 3—3 of FIG. 2H which illustrates one quadrant of an array of apertures in the apertured nonplanar electrode of FIG. 2H.

FIG. 3 shows an exemplary quadrant of the array 102 of apertures 94. The apertures stop short of the perimeter of the apertured nonplanar electrode 100 to form an annular rim 104 which is an integral part of the webs 80 (in the above processes, the rim 104 is processed in a manner similar to that of the webs 80 ). The rim 104 facilitates installation of the apertured nonplanar electrode 100 into an ion-optics system that includes other apertured nonplanar electrodes.

Figure 1F:
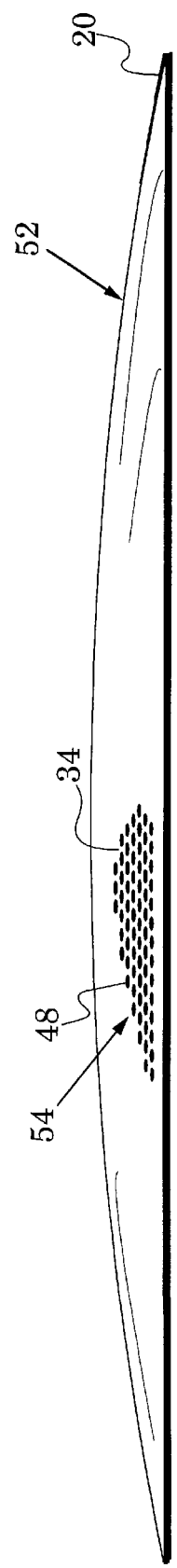

The positional accuracy of the apertures 94 of FIGS. 2H and 3 is improved (e.g., compared to the apertures 48 of FIG. 1F) because the deformation step that produced the nonplanar electrode 64 of FIG. 2B preceded process steps that produced the photoresist pattern of the prepared electrode 90 of FIG. 2F. Therefore, no deformation process steps have an opportunity to spatially alter the photoresist pattern. It has been calculated that the fabrication processes of FIGS.

2A–2H can realize a positional accuracy of better than 50 micrometers, e.g., an accuracy of ~25 micrometers which is a fivefold improvement over the conventional process of FIGS. 1A–1F. In an ion-optics system formed by a plurality of nonplanar electrodes, this positional accuracy improves the coaxial alignment of apertures and, consequently, the performance and lifetime of the ion-optics system.

Processes of FIGS. 2A–2H can be interchanged as long as deformation steps continue to precede process steps which finalize the photoresist pattern. For example, the coating step of FIG. 2C can be interchanged with the deformation step of FIG. 2A. That is, another process embodiment can first coat the planar sheet 60 of FIG. 2A with a negative photoresist and subsequently deform this coated sheet into the coated nonplanar electrode 70 of FIG. 2C.

Figure 4:
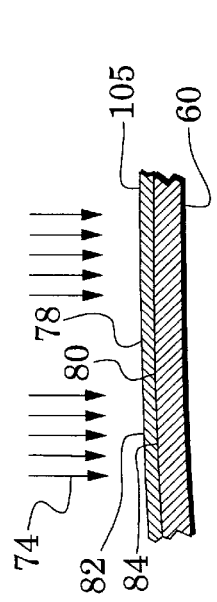
FIG. 4 is a view similar to an enlarged portion of FIG. 2D which replaces a negative photoresist with a positive photoresist.
Figure 5:
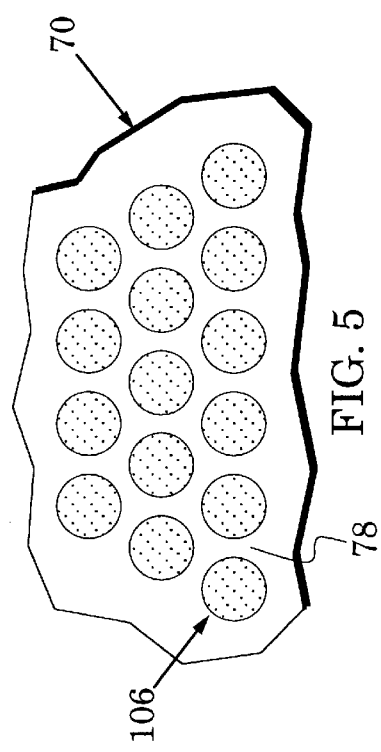
FIG. 5 is a view similar to FIG. 2E which replaces a ring-shaped laser beam with a circular laser beam.

Other process embodiments of the invention can be formed with different photoresists and different laser beam patterns. For example, FIG. 4 is similar to the enlarged portion of FIG. 2D with like elements indicated by like reference numbers and FIG. 5 is similar to FIG. 2E with like elements indicated by like reference numbers. However, the negative photoresist 66 of FIG. 2D is replaced in FIG. 4 with a positive photoresist 105 and the ring-shaped laser beam 86 of FIG. 2E is replaced with a circular laser beam 106 in FIG. 5. In this process embodiment of the invention, photoresist portions 82 that cover future electrode aperture portions 84 are radiated and photoresist portions 78 that cover future electrode web portions 80 are not radiated.

When positive photoresist is radiated, photosensitizers in a base polymer of the photoresist are destroyed so that the dissolution rate during development is increased. Thus, the radiated portions of the photoresist can be developed away leaving the nonradiated portions behind. As a result of this process step, only the nonradiated photoresist portions 78 will remain over web portions 80 of a prepared nonplanar electrode 90 as illustrated in FIG. 2F.

Other process embodiments of the invention can be formed with different etching processes. For example, the arrows 92 of FIG. 2F can represent a dry etch process rather than a wet chemical etch process. Exemplary dry etch processes include exposure of a nonplanar member to a reactive gas plasma, exposure to accelerated ions of a reactive gas plasma or exposure to accelerated ions of an inert gas plasma.

Manipulation of the laser beam 86 in FIG. 2E or the laser beam 106 in FIG. 5 can be realized with any conventional optical process, e.g., with beam-splitting mirrors and/or a controllable fixture which holds and moves the coated nonplanar electrode 70 of FIG. 2D and 2E. The ring shape of the beam 86 can be formed by directing laser energy through a ring-shaped mask that is carried on a quartz member. For example, the mask can include a copper disc and an outer mask member which has a hole that coaxially surrounds the disc. The disc defines the inner margin of the ring and the outer mask member defines the outer margin of the ring.

The apertured nonplanar electrode 100 of FIG. 2H is especially suited for enhancing the ion-optics performance and lifetime of any system in which ion beams are formed and accelerated. As mentioned above, such systems include ion thrusters, ion-beam implantation systems and neutral-beam accelerators.

Figure 6:
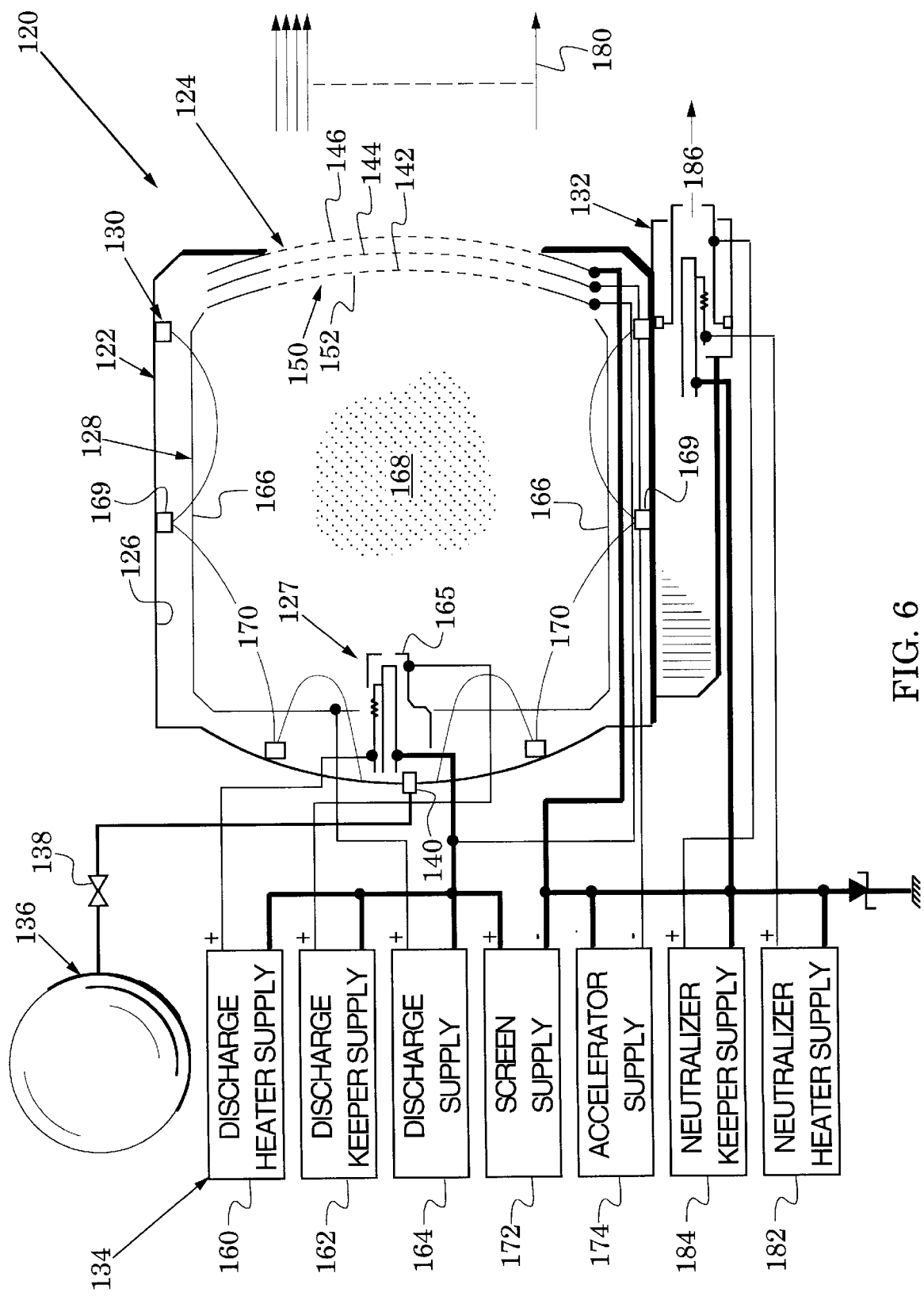
FIG. 6 is an elevation view of an ion thruster whose performance is enhanced by fabricating its apertured nonplanar electrodes with the processes of the present invention.

An exemplary ion thruster 120 is illustrated in FIG. 6. The thruster 120 has an open-ended housing 122 and an ion-optics system 124 which is positioned across an open end of the housing 122 to form an ionization chamber 126.

The thruster 120 also includes a discharge electron source 127 and an electrode system 128 which are positioned within the chamber 126, a magnetic field generator 130 which is also positioned within the chamber 126, a neutralizer 132 that is positioned adjacent the ion-optics system 124 and a power supply system 134 which generates bias voltages for application to various thruster structures. A vessel 136 contains a supply of an ionizable gas (e.g., xenon), and is coupled to the chamber 126 by a valve 138 and a flow orifice 140.

The ion-optics system 124 has a screen grid 142, an accelerator grid 144 and a decelerator grid 146 arranged in a spaced relationship. These apertured nonplanar electrodes are preferably fabricated by the processes of the present invention. An array 150 of coaxially-aligned aperture sets 152 are formed by these grids with each aperture set including one aperture in each of the grids (e.g., apertures 94 of FIG. 2H). The apertures of each aperture set are arranged in a coaxial relationship.

In operation of the ion thruster 120, the valve 138 is opened by a thruster control system and the flow orifice 140 meters ionizable gas into the chamber 126 from the vessel 136. A discharge heater supply 160 and a discharge keeper supply 162 cause the electron source 127 to generate primary electrons.

A discharge supply 164 is applied to the electrode system 128 which typically includes a cathode 165 in the electron source 127 and an anode 166 that is adjacent the housing 122. This accelerates primary electrons into collisions with gas atoms to generate a plasma 168 of ions and electrons in the chamber 126. The magnetic field generator 130 typically includes a system of annular permanent magnets 169 which generate magnetic flux lines 170 that cause electrons to travel along extensive paths prior to being collected by the electrode system 128. These extensive electron paths increase the number of collisions with gas atoms and thus enhance the generation of the plasma 168.

A screen supply 172 biases the apertures of the screen grid 142 to facilitate the flow of ion beamlets from the plasma 168. An accelerator supply 174 biases the accelerator grid 144 to accelerate these beamlets through accelerator apertures before they are decelerated slightly as they pass between the accelerator grid 144 and the decelerator grid 146. The accelerator grid 144 provides a collimating influence on the ion beamlets which together form an ion beam 180.

The ion beam 180 issues from the ion-optics system 124 and its momentum generates a force upon the ion thruster 120 and attached structures (e.g., a spacecraft). If not otherwise compensated, the positive charge flow of the ion beam 180 would develop a negative charge on the ion thruster 120 that would degrade the thruster's force. Accordingly, a neutralizer 132 injects an electron stream 186 into the proximity of the ion beam 180 to neutralize space charges as well as the positive ion current. Power forms to operate the neutralizer 132 are provided by a screen supply 172, a neutralizer heater supply 182 and a neutralizer keeper supply 184.

Although the nonplanar shape of the apertured nonplanar electrode 100 of FIG. 2H is preferably spherical for use in the thruster 120 of FIG. 6, the fabrication processes of the invention can produce improved aperture positional accuracy in electrodes of various nonplanar shapes, e.g., elliptical. Although the planar sheet of FIG. 1A can be comprised of other metals, it is preferably comprised of molybdenum for use in the thruster 120 because of its low sputter yield, high strength and good formability.

Processes of the invention have been described with a one-sided photoresist. For example, the photoresist 66 is shown on the upper side of the coated nonplanar electrode 70 in FIG. 2C. Preferably, the teachings of the invention are praciticed with a two-sided photoresist. In a two-sided photoresist process, a lower photoresist layer 67 is also applied to the lower side of the coated nonplanar electrode 70 as indicated by broken lines in FIGS. 2C and 2D. The radiation 74 of FIG. 2D would then be directed to both sides of the coated nonplanar electrode 70 in FIG. 2D.

After photoresist removal, photoresist portions 79 remain on the lower side of the prepared nonplanar electrode 90 as shown in broken lines in FIG. 2F. The photoresist portions 79 would substantially match the photoresist portions 78 on the upper side of the electrode 90.

Finally, the chemical etchant 92 of FIG. 2F would be directed to both sides of the prepared nonplanar electrode 90 to create the apertures 94 of FIG. 2G. This two-sided photoresist process generally yields superior wall definition in the apertures 90 because the etchant 92 progresses inward from both sides of the electrode.

Although the invention has been illustrated with apertures that have an exemplary circular shape, the teachings of the invention may be practiced with apertures of any cross-sectional shape, e.g., the hexagonal aperture 190, the square aperture 192 and the triangular aperture 194 that are shown in the lower left portion of FIG. 3.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A method for forming an apertured nonplanar electrode, comprising the steps of:
   providing a metallic, nonplanar member;
   coating said nonplanar member with a photoresist;
   with a laser beam, radiating portions of said photoresist to define web photoresist portions and removable aperture photoresist portions between said web photoresist portions;
   removing said aperture photoresist portions; and
   etching said nonplanar member to form apertures between said web photoresist portions.

2. A method for forming an apertured nonplanar electrode, comprising the steps of:
   providing a metallic, nonplanar member;
   coating web portions of said nonplanar member with photoresist;
   etching said nonplanar member to form apertures between said web portions; and
   removing said photoresist;
   wherein said coating step includes the steps of:
   a) covering said nonplanar member with a negative photoresist;
   b) radiating only said web portions of said photoresist; and
   c) removing nonradiated photoresist;
   and wherein said radiating step includes the step of directing a ring-shaped laser beam onto said web portions.

3. A method for forming an apertured nonplanar electrode, comprising the steps of:
   providing a metallic, nonplanar member;
   coating web portions of said nonplanar member with photoresist;
   etching said nonplanar member to form apertures between said web portions; and
   removing said photoresist;
   wherein said coating step includes the steps of:
   a) covering said nonplanar member with a positive photoresist;
   b) radiating aperture portions of said photoresist which are between said web portions; and
   c) removing radiated photoresist;
   and wherein said radiating step includes the step of directing a laser beam onto said aperture portions.

4. The method of claim 1, wherein said providing step includes the step of deforming a metallic, planar member into said nonplanar member.

5. The method of claim 4, wherein said deforming step includes the step of hydroforming said planar member.

6. The method of claim 1, wherein said nonplanar member has a spherical shape.

7. The method of claim 1, wherein said nonplanar member has an elliptical shape.

8. The method of claim 1, wherein:
   said coating step includes the step of covering said nonplanar member with a negative photoresist;
   said radiating step includes the step of restricting said radiating step to said web photoresist portions of said photoresist; and
   said removing step includes the step of removing nonradiated photoresist.

9. The method of claim 1, wherein:
   said coating step includes the step of covering said nonplanar member with a positive photoresist;
   said radiating step includes the step of restricting said radiating step to said aperture photoresist portions of said photoresist; and
   said removing step includes the step of removing radiated photoresist.

10. The method of claim 1, wherein said etching step includes the step of applying a chemical etchant to said nonplanar member.

11. The method of claim 1, wherein said etching step includes the step of exposing said nonplanar member to a plasma of a reactive gas.

12. The method of claim 1, wherein said etching step includes the step of exposing said nonplanar member to accelerated ions of a plasma of a reactive gas.

13. The method of claim 1, wherein said removing step includes the step of applying a solvent to said photoresist.

14. The method of claim 1, wherein said nonplanar member comprises molybdenum.

15. The method of claim 1, wherein said etching step includes the step of forming said apertures with a circular cross-sectional shape.

16. The method of claim 1, wherein said etching step includes the step of forming said apertures with a hexagonal cross-sectional shape.

17. A method for forming an apertured nonplanar electrode, comprising the steps of:
   coating a metallic, planar member with photoresist;
   deforming said planar member into a nonplanar member;
   removing said photoresist from all but web portions of said nonplanar member; and
   etching said nonplanar member to form apertures between said web portions.

18. The method of claim 17, wherein said deforming step includes the step of hydroforming said planar member.

19. The method of claim 17, wherein said nonplanar member has a spherical shape.

20. The method of claim 17, wherein said nonplanar member has an elliptical shape.

21. The method of claim 17, wherein said coating step includes the step of covering said planar member with a negative photoresist and said removing step includes the steps of:

radiating only said web portions of said photoresist; and removing nonradiated photoresist.

22. The method of claim 21, wherein said radiating step includes the step of directing a ring-shaped laser beam onto said web portions.

23. The method of claim 17, wherein said coating step includes the step of covering said planar member with a positive photoresist and said removing step includes the steps of:

radiating aperture portions of said photoresist which are between said web portions; and removing radiated photoresist.

24. The method of claim 23, wherein said radiating step includes the step of directing a laser beam onto said aperture portions.

25. The method of claim 17, wherein said etching step includes the step of applying a chemical etchant to said nonplanar member.

26. The method of claim 17, wherein said etching step includes the step of exposing said nonplanar member to a plasma of a reactive gas.

27. The method of claim 17, wherein said etching step includes the step of exposing said nonplanar member to accelerated ions of a plasma of an inert gas.

28. The method of claim 17, further including the step of applying a solvent to remove said photoresist.

29. The method of claim 17, wherein said nonplanar member comprises molybdenum.

30. The method of claim 17, wherein said etching step includes the step of forming said apertures with a circular cross-sectional shape.

31. The method of claim 17, wherein said etching step includes the step of forming said apertures with a hexagonal cross-sectional shape.

* * * * *